United States Patent Office 3,806,382
Patented Apr. 23, 1974

3,806,382

VAPOR-SOLID IMPURITY DIFFUSION PROCESS

William A. Fitzgibbons, Essex Junction, Donald M. Kenney, Shelburne, and Ronald A. Michaud, Essex Junction, Vermont, assignors to International Business Machines Corporation, Armonk, N.Y.

No Drawing. Filed Apr. 6, 1972, Ser. No. 241,821
Int. Cl. H01l 7/34
U.S. Cl. 148—188 11 Claims

ABSTRACT OF THE DISCLOSURE

A vapor-solid diffusion process for providing accurate and controllable quantities of semiconductor conductivity determining impurities in semiconductor surfaces wherein a normally undesirable semiconductor-impurity phase material is used to provide a substantially unlimited and constant source of impurity in a deposition and first diffusion step and wherein an oxidizing atmosphere is provided immediately after initial deposition, prior to final drive-in, in order to convert the phase material to a soluble compound which is removed prior to drive-in. The process provides for higher surface concentrations of impurities and avoids the known disadvantages of the phase material.

BACKGROUND OF THE INVENTION

This invention relates to techniques for improving vapor-solid diffusion processes in which a conductivity determining impurity is diffused into a semiconductor surface and more particularly to a method of eliminating insoluble phase material deposited during an initial diffusion step prior to drive-in.

In the manufacture of semiconductor devices it is well known to utilize diffusion processes to selectively modify the conductivity of semiconductor surfaces. Various diffusion techniques are well known in the art and are reviewed in Runyan, Silicon Semiconductor Technology, McGraw Hill, 1965. Because it is difficult to control the concentration in the gas phase of the impurity to be diffused, it is normally preferable to utilize a two-step diffusion process. The first diffusion step usually comprises the vapor deposition of the impurity in the form of a surface oxide or glassy layer on the silicon surface. This initial diffusion, or deposition, step provides a relatively fixed surface concentration of impurity, or dopant, but generally does not provide an acceptable impurity distribution in the host silicon. The second diffusion step, usually termed drive-in, is performed in the absence of the impurity containing vapor. This step, normally performed at a higher temperature than the deposition step, usually takes place after removal of the glassy layer. During drive-in there is only a limited quantity of impurity available for diffusion and thereby results in a more flattened impurity distribution profile resulting in a lower surface concentration or higher surface resistivity, as well as a deeper diffusion depth. It has been observed that if the impurity containing oxide which forms the initial glassy layer on the surface of a semiconductor, such as silicon or germanium, is present in sufficient quantity a semiconductor-impurity phase material forms between the glassy layer and the semiconductor surface. For some impurity types, such as boron and arsenic on silicon, the phase material is difficult to remove as it is insoluble in any solvent that will not dissolve silicon, and must be removed by mechanical methods. Mechanical methods, such as lapping, result in the removal of a surface layer of silicon, thus lowering surface concentration resulting in higher sheet resistivity. In addition, the phase material exhibits a high resistivity and may be detrimental to the formation of ohmic contacts in diffused areas at a later point in the manufacturing process.

DESCRIPTION OF THE PRIOR ART

Due to the above referred to disadvantages to the formation of the phase material much effort has been directed to developing diffusion techniques which prevent the initial formation of the insoluble phase material. For example, if the amount of impurity containing oxide available in the deposition system is kept sufficiently low no phase material will form. Control of the quantity of reactive material, such as water vapor, present during deposition will also successfully prevent the formation of the undesirable phase material. Additional techniques known to prevent the formation of this phase layer include the deposition of quantities of silicon dioxide along with the glassy layer.

In some situations it is, however, desirable to intentionally allow the formation of the phase material in order to achieve a specific high surface concentration unobtainable with the glassy layer alone. For example, Busen et al., "Elipsometric Investigations of Boron Rich Layers in Silicon," J. Electrochem. Soc., vol. 115, pages 291–294, 1968, disclose that if deposition is performed utilizing a boron-rich phase layer more uniform diffusions result. It is also clear from the last mentioned work that removal of the phase material prior to drive-in is essential to the preparation of suitable diffusions, and that the phase material, if not removed, presents an undesirable source of dopant material during drive-in. Parekh et al., "The Influence of Reaction Kinetics Between $BBr_3$ and $O_2$ on the Uniformity of Base Diffusions," Proc. IEEE, vol. 57, pages 1507–1512, 1969, teach that anodization or low temperature oxidation are known, but ineffective, methods of removing the "boron skin" formed between the glassy layer and silicon surface.

Both of the referenced methods for removing the phase material are undesirable in a manufacturing environment due to the additional processing required between deposition and drive-in.

It is a primary object of the instant invention to provide a diffusion process which enables the use of a silicon impurity phase material to provide a high surface concentration of impurity atoms during deposition and to provide for the effective removal of surface phase material without additional processing steps.

It is a secondary object of the invention to reduce the time and cost of manufacturing integrated circuit devices utilizing diffusion processes.

A further object is to provide a diffusion technique suitable for providing improved uniformity of diffused semiconductor surface resistivity.

SUMMARY OF THE INVENTION

The instant invention provides an improved process for the vapor-solid diffusion of impurity materials in semiconductors wherein an insoluble impurity-semiconductor phase material is formed on the surface of the semiconductor to provide a high concentration of impurity in the surface as a diffusion source for the final diffusion step. The formation of the phase material is followed by providing an oxidizing atmosphere containing sufficient excess oxidant to convert the phase material to a soluble oxide which is thereafter removed to allow a normal drive-in step to complete the diffusion process.

The foregoing and other objects, features and advantages of the invention will be apparent from the following more particular description of the preferred embodiments of the invention.

DESCRIPTION OF THE PREFERRED EMBODIMENT

In accordance with the instant invention the semiconductor diffusion process is preferably carried out by the well known and extensively used open-tube diffusion apparatus described in the previously referred to references.

While the instant invention relates only to the impurity diffusion aspects of the manufacture of semiconductor devices, it will be understood by those skilled in the art that many other manufacturing steps are necessary to fabricate a complete device. For a more detailed description of a typical manufacturing process, reference is made to Agusta et al., U.S. Pat. 3,508,209, issued Apr. 21, 1970, and assigned to the assignee of the instant invention.

Semiconductor wafers are prepared for the subject diffusion process by standard procedures and may generally have an oxide masking layer formed on its surface by known thermal techniques. The oxide, generally on the order of 3,000 to 15,000 angstrom units thick, is selectively removed by well known photoetching techniques to define the areas of the wafer into which the impurity is to be diffused.

In order to provide for the formation of the impurity containing phase material on the exposed semiconductor surface a source of impurity, preferably in the form of an oxide, is deposited by vapor deposition techniques on the surface of the semiconductor wafer. While it is preferred to utilize an impurity-oxide as a diffusion source, deposited through vaporization and transport to the semiconductor surface by an inert carrier gas, other initial diffusion, or deposition, techniques resulting in the formation of an impurity-oxide layer on the semiconductor surface are also envisioned. For example, the boron oxide deposition process described in U.S. Pat. 3,374,125, wherein boron trioxide coated boron nitride wafers are mounted facing silicon wafers to be diffused and argon is used as a carrier gas, may be used. Other known impurity deposition techniques such as the oxidation of impurity-halides or hydrides, $BBr_3$, $AsCl_3$, $B_2H_6$, etc., may also be employed.

In the practice of the subject invention it is necessary to provide a sufficiently high impurity containing oxide deposition rate to cause the formation of a layer of high concentration impurity-semiconductor phase material between the semiconductor surface and the glassy oxide layer deposited. This phase layer is known to be rich in impurity concentration and has, in the case of boron in silicon, for example, been suggested by some researchers to be of the composition $SiB_6$. The layer of impurity-semiconductor phase material acts as an unlimited diffusion source during the deposition step and provides a high and uniform surface concentration of impurity in the semiconductor surface prior to final drive-in. Uniformity is obtained due to the fact that the impurity concentration in the phase material is higher than the solid solubility of the impurity in the semiconductor, thereby, fixing the surface concentration to that of the solid solubility of the impurity in the semiconductor. The necessary process conditions required to perform the initial diffusion, or deposition, step depends primarily on the desired device characteristics required by a particular design specification. For example, when using $B_2O_3$ as an impurity source and silicon as the semiconductor, deposition temperatures on the order of about 800–1300° C. may be utilized in an inert atmosphere. Likewise, deposition times are dependent on desired device characteristics.

It will be rocognized by those skilled in the art that various diffusion temperatures, times, carrier gases and reacting gases may be used to obtain the desired prediffusion condition.

In order to insure the formation of the impurity semiconductor phase layer it is important not to provide conditions which will cause the formation of a semiconductor-oxide, or glassy layer, to the exclusion of the phase material. In techniques using impurity oxide source materials this problem is avoided by utilizing an inert carrier gas during the initial portion of the deposition step.

After the above described initial portion of the deposition step, it is necessary to provide a predominately oxidizing atmosphere in the open-tube apparatus to convert the impurity-semiconductor phase material to a soluble oxide, or oxidation product, comprising oxides of the impurity and the semiconductor. This is accomplished at the end of the deposition step. The oxidation is preferably accomplished in the same apparatus and under the same conditions as the impurity deposition with the exception that oxygen, for example, is supplied to the diffusion tube. It is not necessary to remove the impurity source from the diffusion tube.

It is important that the oxidation of the deposited impurity-semiconductor phase material layer be accomplished only at the end of the deposition step. The premature presence of a predominately oxidizing condition will interfere with the formation of a sufficient quantity of the required impurity-semiconductor phase material and result in much lower surface impurity concentration. The absence of the oxidation condition results in the presence of the undesirable impurity phase material and necessitates the use of inefficient phase removal steps prior to the final drive-in process. Failure to remove the impurity containing oxide at all results in uncontrollable diffusions due to the unlimited source of impurity in the phase material and glassy layers if drive-in is performed in a non-oxidizing atmosphere. If drive-in is performed in an oxidizing atmosphere the presence of the impurity containing oxide does not necessarily effect the concentration of impurity in the semiconductor but does effect the electrical properties of the oxide due to the presence of impurity in the oxide.

Following the deposition step, the wafers are removed from the diffusion tube and the converted impurity containing oxide is removed by well known etching techniques. The wafers are preferably immersed in an etching solution, preferential to the doped oxide layer, for a time sufficient to allow removal of all of the impurity containing oxide from the surface of the wafers. Because the thickness of the original selectively etched thermal oxide layer is significantly greater than that of the doped oxide, etchants capable of etching the thermal oxide may also be used so long as a sufficient quantity of the initial oxide is retained during the etching step to prevent autodoping of the semiconductor surface during drive-in of areas not previously delineated.

Following the removal of the doped oxide, the semiconductor wafers, containing a shallow impurity concentration, are subjected to a solid state diffusion step in the absence of an external impurity source. This step is commonly referred to as the drive-in step. It will be recognized that the drive-in step will not necessarily result in the final impurity distribution desired, depending upon whether or not additional hot step processing is to be experienced before the completion of the desired semiconductor device. The extent, temperature and other conditions of the drive-in step will be determined by the particular device characteristics required. It is normally preferable to carry out the drive-in step in the presence of an oxidizing atmosphere in order to form a protective oxide over the diffused regions.

The following examples illustrate specific and preferred embodiments of the invention, and are not intended to limit the scope of the invention.

EXAMPLE I

Silicon wafers about 2¼" in diameter and having an n-type epitaxial surface layer were first heated in an oxidizing atmosphere to form an initial protective oxide about 4,000 angstrom units thick. The oxide was selectively etched by standard photoetch techniques to expose silicon in the areas to be diffused.

The P-type impurity used for diffusion was boron and the particular technique utilized was similar to that disclosed in U.S. Pat. 3,374,125 in that boron trioxide coated boron nitride discs were used as a boron trioxide source. The boron nitride discs used were about the same size as the semiconductor wafers and are available from The Carborundum Company as Grade A Combat (trademark) Boron Nitride and contain about 41.5% boron. Prior to the actual diffusion operation, the discs were oxidized to form a boron trioxide surface layer which acts as the actual source of boron trioxide in the diffusion process. The standard diffusion tube used was about 72 mm. in diameter and about 5 feet long. Provisions were made at the end of the tube to provide gas supplies. A source of nitrogen was supplied to the tube at a rate of 800 cubic centimeters per minute which was maintained throughout the deposition process.

The semiconductor wafers and boron trioxide coated source discs were placed vertically in quartz boats such that each surface of a silicon wafer to be diffused was facing an oxidized boron nitride disc. The wafers were then placed in the tube which was maintained at a temperature of 950° C. for 37 minutes in order to form the desired boron-silicon phase material which acts as the initial diffusion boron source. At the end of this time about 3,000 cubic centimeters per minute oxygen was supplied to the furnace for 5 minutes in order to convert the phase material to a suitable borosilicate glass comprising both silicon and boron oxides.

At the conclusion of the diffusion step the wafers were removed, allowed to cool and etched for one minute in a P-etch to remove the containing glass layer. The P-etch consisted of 1320 milliliters $H_2O$, 60 milliliters of 48% HF and 44 milliliters of 69% $HNO_3$.

Silicon surface resistivities measured after prediffusion showed a uniform sheet resistivity of 80 ohms per square.

A standard drive-in and final oxidation step followed the etching and consisted of a dry-wet-dry process performed at 1100° C. The cycles and times were: oxygen (55 minutes), oxygen plus steam (22 minutes) and oxygen (35 minutes).

The resulting diffusions had a mean sheet resistivity of 139.9 ohms per square having a total run variation for all wafers of ±4½%.

EXAMPLE II

The apparatus for this example was the same as that of Example I. The procedure was modified in order that a significantly lower surface resistivity would be obtained.

The silicon wafers and oxidized boron nitride discs (Carborundum Grade M containing 17.0% boron) were placed in the diffusion furnace as in Example I, and maintained at 1150° C. for 80 minutes in the presence of 800 cubic centimeters per minute nitrogen. While still maintaining the temperature and nitrogen flow, 3,000 cubic centimeters per minute flow of oxygen was passed over the wafers for 5 minutes. The silicon wafers were cooled and etched for 5 minutes in the P-etch solution. Sheet resistivity after the prediffusion step measured 1.6 ohms per square.

Finally, a drive-in and oxidation step was performed which consisted of exposing the prediffused wafers to 3,000 cubic centimeters per minute nitrogen and 800 cubic centimeters per minute oxygen at 1150° C. for 120 minutes. Sheet resistivity after drive-in measured 2.0 ohms per square having a total run variation for all wafers of ±4%.

Thus it can be seen from the above examples that the normally undesirable impurity-semiconductor phase material known to be formed in certain diffusion processes can be successfully used to provide a wide range of accurately controlled surface resistivities without the disadvantages of providing expensive additional processing steps normally used to eliminate the insoluble phase material.

While the invention has been particularly shown and described with reference to a particular embodiment thereof it will be understood by those skilled in the art that the foregoing and other changes in form and details may be made therein without departing from the spirit and scope of the invention.

What is claimed is:

1. A method of diffusing a semiconductor conductivity determining impurity material into a surface region of a semiconductor body comprising the steps of:

depositing from the vapor phase an impurity containing oxide layer over the surface region of the semiconductor body in a predominantly non-oxidizing flowing atmosphere at a predetermined temperature for a first predetermined time period to form an impurity-semiconductor phase material between said deposited oxide and the surface region of the semiconductor body to provide an initial concentration of said impurity material in said surface region;

exposing said semiconductor body to a predominantly oxidizing flowing atmosphere while continuously maintaining said predetermined temperature for a second predetermined time period to convert said impurity-semiconductor phase material to an oxidation product;

removing said impurity containing oxide and oxidation product from the surface region of said semiconductor body; and heating said semiconductor body to produce the desired distribution of said impurity in said semiconductor body.

2. The method of claim 1 wherein said impurity material is chosen from the group consisting of boron and arsenic.

3. The method of claim 1 wherein said impurity material is boron and said predetermined temperature is between 800 and 1300° C.

4. The method of claim 1 wherein said semiconductor body is chosen from the group consisting of silicon and germanium.

5. The method of claim 1 wherein said semiconductor body is silicon.

6. The method of claim 5 wherein said heating step additionally includes an oxidizing atmosphere to provide a protective silicon oxide layer on said surface region.

7. The method of claim 1 wherein said second predetermined time period is less than said first predetermined time period.

8. The method of claim 1 wherein said impurity containing oxide and said oxidation product are removed by immersion in a liquid etchant.

9. The method of diffusing boron into a surface region of a silicon semiconductor body comprising the steps of:

exposing said body to an atmosphere comprising an inert carrier gas and boron trioxide vapor for a first predetermined time period at a temperature between 800 and 1300° C. to form a layer of a boron-silicon phase material on said surface region, said phase material providing an initial concentration of boron at the surface of said silicon body;

exposing said silicon body to a flowing, oxidizing atmosphere for a second predetermined time period while continuously maintaining said temperature to convert said phase material to a soluble boron oxide;

removing said boron oxide by etching to remove substantially all of said boron containing oxide from said silicon body; and heating said silicon body in an oxidizing atmosphere to distribute the initially diffused boron into said silicon body and to provide a protective layer of silicon dioxide over the diffused region.

10. The method of claim 9 wherein said second predetermined time period is about 5 minutes.

11. The method of claim 9 wherein said inert carrier gas is nitrogen.

References Cited

UNITED STATES PATENTS

| | | | |
|---|---|---|---|
| 3,574,009 | 4/1971 | Chizinsky et al. | 148—188 X |
| 3,690,969 | 9/1972 | Hays et al. | 148—188 |
| 3,374,125 | 3/1968 | Goldsmith | 148—189 |
| 3,203,840 | 8/1965 | Harris | 148—187 |
| 3,673,679 | 7/1972 | Carbajal et al. | 148—188 X |
| 3,676,231 | 7/1972 | Medvecky et al. | 148—188 |

OTHER REFERENCES

Busen et al., "Removal of a Silicon-Boron Phase Which Forms During Deposition," Electrochemical Technology, vol. 6, No. 7–8 (July–August 1968), pp. 256–7.

Busen et al., "Controlled Removal of a Si-B Phase which Forms During Deposition," J. of Electrochem. Soc., vol. 114, No. 6 (June 1967), p. 144c, TP250.A54J.

Busen et al., "Ellipsometric Investigations of Boron-Rich Layers on Silicon," J. of Electrochem. Soc., vol. 115, No. 3 (March 1968), pp. 291–294, TP250.A54J.

GEORGE T. OZAKI, Primary Examiner

U.S. Cl. X.R.

148—186, 187, 189